United States Patent
Noble

Patent Number: 5,932,908
Date of Patent: *Aug. 3, 1999

[54] TRENCH EPROM

[75] Inventor: Wendell Phillips Noble, Milton, Vt.

[73] Assignee: International Business Machines Corporation, Armonk, N.Y.

[*] Notice: This patent is subject to a terminal disclaimer.

[21] Appl. No.: 08/760,090

[22] Filed: Dec. 11, 1996

Related U.S. Application Data

[62] Division of application No. 08/481,675, Jun. 7, 1995, Pat. No. 5,598,367.

[51] Int. Cl.$^6$ ..................................................... H01L 29/80
[52] U.S. Cl. .......................... 257/315; 257/318; 365/149; 365/185.01
[58] Field of Search ..................................... 257/318, 315, 257/323; 365/149, 185.01, 185.18

[56] References Cited

U.S. PATENT DOCUMENTS

| | | |
|---|---|---|
| 3,660,819 | 5/1972 | Frohman-Bentchkowsky .... 317/235 R |
| 3,843,954 | 10/1974 | Hansen et al. ...................... 340/173 R |
| 4,845,538 | 7/1989 | Hazani ...................................... 357/23.5 |
| 5,016,068 | 5/1991 | Mori ........................................ 357/23.5 |
| 5,196,722 | 3/1993 | Bergendahl et al. .................... 257/304 |
| 5,598,367 | 1/1997 | Noble ....................................... 365/149 |

Primary Examiner—Sara Crane
Attorney, Agent, or Firm—James M. Leas

[57] ABSTRACT

A two-device nonvolatile memory cell is described. The cell comprises a planar FET and a vertical FET in series. The vertical FET has a floating gate that is predominantly capacitively coupled to a buried n well that serves as the control electrode. The structure is very similar to a trench DRAM cell, and the nonvolatile memory cell can be integrated onto a DRAM chip.

5 Claims, 4 Drawing Sheets

TRENCH EPROM

This application is a division of application Ser. No. 08/481,675 filed Jun. 7, 1995, now U.S. Pat. No. 5,598,367.

FIELD OF THE INVENTION

This invention generally relates to nonvolatile memory. More particularly it relates to erasable and programmable read only memory (EPROM) and to electrically erasable and programmable read only memory (EEPROM). It also relates to a memory chip incorporating both DRAM and nonvolatile memory.

BACKGROUND OF THE INVENTION

Erasable programmable read only memory (EPROM) cells commonly use FEB devices with a floating gate structure on which charge can be stored. The charge stored on the floating gate controls the threshold voltage, Vt, of the FET, and the logic state of the memory cell depends upon that Vt Charge is added to or removed from the floating gate through the floating gate insulator using a capacitively coupled control gate stacked on the floating gate and separated therefrom by a control gate insulator.

The floating gate is typically charged by injecting hot carriers into the floating gate in the high electric field region adjacent the drain of the FET. When the floating gate is negatively charged, an n-channel FET is in a high Vt state. If sufficient charge is injected, the FET will be biased in a non-conducting state. Charge is removed from the floating gate by providing a voltage across the floating gate insulator sufficient to enable Fowler-Nordheim tunneling through that insulator from the floating gate. When the floating gate is discharged the FET is in a low Vt state. If sufficient charge is removed, the FET will be biased in a conducting state; The cell is read by detecting the magnitude of the current flowing through the FET, which varies with its Vt.

When operating the EPROM it is desirable to have the floating gate voltage track closely with the control gate voltage. To divide the voltage most advantageously, a large coupling capacitance between the floating gate and the control gate and a small coupling capacitance between the floating gate and everything else, such as the substrate and the source and drain regions, is therefore desirable. However, stacked floating and control gates need be of approximately the same size, making difficult the task of making control to floating gate capacitance significantly larger than floating gate to substrate or source/drain capacitance.

An alternate scheme, described in commonly assigned U.S. patent application Ser. No. 08/239,078, to Ohsaki, describes an EEPROM cell formed of a pair of standard CMOS FETs having connected floating gates in which an n well serves as the control gate (or control electrode). While this scheme does not require additional process steps, it does require added surface area to accommodate the two FETs and the well.

Thus, a structure which decouples floating gate and control gate capacitances without requiring additional surface area is very desirable.

SUMMARY OF THE INVENTION

It is therefore an object of the present invention to provide a nonvolatile memory structure in which the floating-gate-to-control-gate capacitance is separately determined from the floating-gate-to-substrate capacitance and the floating gate capacitance to other structures.

It is a further object of the present invention to provide a memory chip having both DRAM and non-volatile memory, the non-volatile memory fabricated by a process compatible with the DRAM process.

It is a further object of the present invention to provide a nonvolatile memory structure that can have the same periodicity and area as a standard DRAM cell.

These and other objects of the invention are accomplished by a semiconductor chip comprising a semiconductor substrate having a planar surface and a first substrate region; a first FET having a first gate adjacent a first gate insulator adjacent a first channel in said first substrate region and a first and a second diffused region; and a second FET connected in series with said first FET, said second FET having a second gate adjacent a second gate insulator adjacent a second channel in said first substrate region, said second gate floating and not connected to said first gate, said second gate predominantly capacitively coupled to a control electrode, said control electrode being a third diffused region.

In another aspect the present invention is a semiconductor chip comprising a nonvolatile memory cell having a vertical floating gate and a buried diffusion surrounding said floating gate, said buried diffusion serving as a control electrode, said floating gate predominantly capacitively coupled to said buried diffusion.

The density of DRAM, SRAM, and EPROM chips has increased rapidly, allowing two or more of these functions to be combined on a single chip. Up until now, EPROM has been difficult to integrate in that it required unique process steps which were not closely related to either DRAM or SRAM structure or process. This invention describes an EPROM cell having a structure that is very similar to that of a DRAM cell and which is substantially fabricated within a DRAM process. Thus, both DRAM and EPROM can be manufactured on the same chip, or at least a common manufacturing line, process, and similar mask set can be used to fabricate both kinds of chips.

BRIEF DESCRIPTION OF THE DRAWINGS

The foregoing and other objects, features, and advantages of the invention will be apparent from the following detailed description of the invention, as illustrated in the accompanying drawings, in which:

FIG. 4b is also a cross sectional view illustrating an erase operation by Fowler-Nordheim tunneling for a cell written according to the first write embodiment of FIG. 4a.

DETAILED DESCRIPTION OF THE INVENTION

The present invention provides a two device non-volatile memory cell (NVRAM) that fits in a trench DRAM cell structure. The process for forming the NVRAM is compatible with the process for forming a trench DRAM cell, permitting both to be integrated on a single chip. In essence, the process for forming the EPROM involves following the steps to form a trench DRAM, but omitting the trench collar and node strap mask from those cells designated for EPROM.

Figure 1:
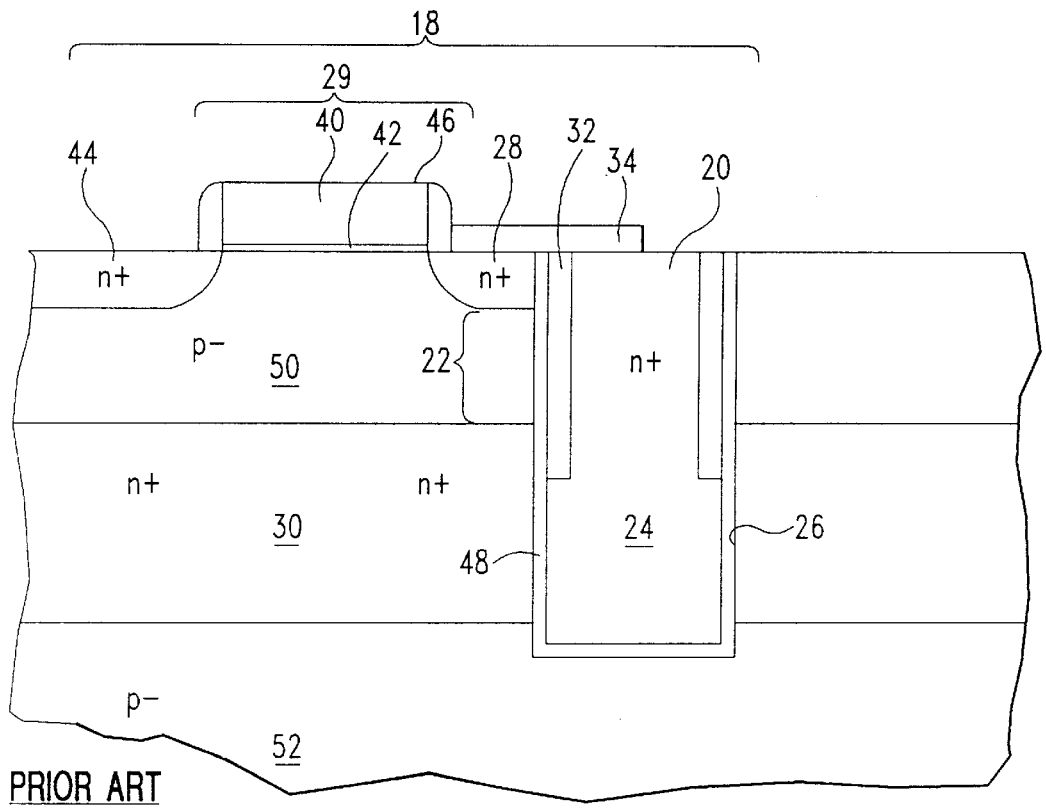
FIG. 1 is a cross sectional view illustrating a DRAM cell of the prior art.

In trench DRAM cell 18, illustrated in FIG. 1, trench capacitor 20 has associated parasitic vertical FET 22, gated by conductor 24 lining trench 26. When turned on, parasitic FET 22 links node diffusion 28 and buried well 30, serving to discharge capacitor 20 of cell 18. Trench collar 32 raises the Vt of parasitic FET 22, significantly increasing cell retention time. In normal operation, strap 34, linking node diffusion 28 of FEF 29 and trench capacitor 20, provides a path to charge or discharge capacitor 20 when gate 40 on gate insulator 42 is high. Gate 40 is part of word line 46 that extends to many cells similar to cell 18. Capacitor insulator 48 lines trench 26, and is formed of a material such as $SiO_2$ or ONO. Trench 26 extends through p well 50, buried n well 30 and p substrate 52.

Figure 2:
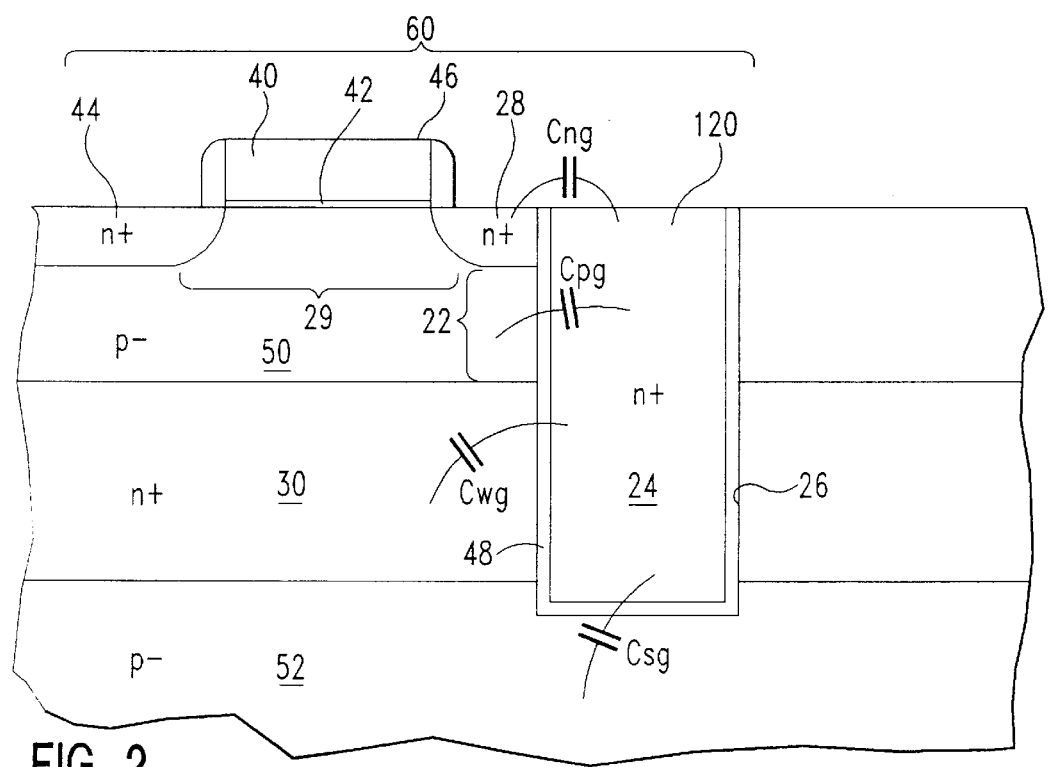
FIG. 2 is a cross sectional view illustrating an EPROM cell of the present invention.

In EPROM cell 60 of the present invention, illustrated in FIG. 2, strap 34 is omitted, leaving trench conductor 24 isolated from node diffusion 28. By also omitting collar 32, trench conductor 24 becomes more closely coupled to floating gate 120 for operating now desired vertical FET 22. It is seen that planar FET 29 and vertical FET 22 are both n-channel devices sharing p well 50 and node diffusion 28.

It is seen that EPROM cell 60 fits into the space of a DRAM cell, has the same spacial periodicity, uses similar wordlines and bitlines, and is formed using similar but fewer process steps. EPROM cell 60 can easily be integrated into a chip also having DRAM cells 18. Alternatively, EPROM chips can be fabricated in the same manufacturing line and using very nearly the same process as required to fabricate DRAM chips.

The design illustrated in FIG. 2 has significant advantage compared with stacked-gate EPROMS of the prior art. Because trench 26 has a large sidewall surface area overlapping buried n well 30, the capacitance between floating gate 120 and buried n well 30, Cwg, can be very much larger than all of the other floating gate capacitances (including Cng, the gate to n+ diffusion capacitance, Cpg, the gate to p well capacitance, and Csg, the gate to substrate capacitance). And this is accomplished using only a minimum of area on the chip surface. Floating gate 120 is therefore said to be predominantly capacitively coupled to buried n well 30.

Figure 3:
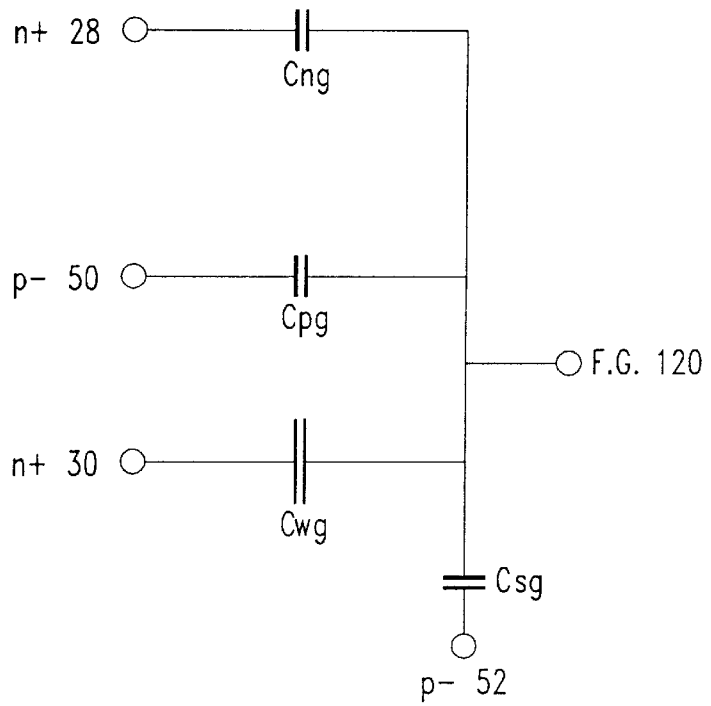
FIG. 3 is a schematic diagram illustrating the capacitive coupling of the floating gate of the vertical FET shown in FIG. 2.

With the structure of FIG. 2, when a voltage is applied between buried n well 30 and node diffusion 28, this applied voltage will be divided according to a ratio, Rcc, that places most of it on floating gate 120. The equivalent circuit diagram shown in FIG. 3, shows the coupling of floating gate 120 to its neighbors. Rcc is defined as Cwg divided by the sum of all capacitances, which in this case is Cwg+Cng+Cpg+Csg. Rcc can be varied by changing the depth of trench 26, buried n well 30, p well 50 and n+ node diffusion 28.

In operation, data is stored in cell 60 by placing or removing charge from floating gate 120 by means of channel hot electron injection (CHEF) or Fowler-Nordheim (F-N) tunneling.

The presence or absence of charge on floating gate 120 is sensed through the resulting shift in Vt of vertical FET 22, and that Vt significantly effects measurable current flow through vertical FET 22. Individual cell 60 is addressed for reading or writing through planar FET 29 by addressing wordline 46 or bit line 44 as in DRAM cell 18. The control gate function conventionally required in an EPROM is performed by buried n well 30; no other control gate is required. As indicated above, buried n well 30 is strongly capacitively coupled to floating gate 120.

Write

Two different embodiments of the write operation are described hereinbelow. The first stores a negative charge on floating gate 120, effectively raising the Vt of vertical device 22 compared to the Vt of FET 22 with a neutral floating gate. The second stores a positive charge on floating gate 120, effectively lowering the Vt of vertical device 22. As will be seen below, the second write embodiment can also be used as a method of removing negative charge from floating gate 120 that was previously stored by the first write embodiment.

Figure 4A:
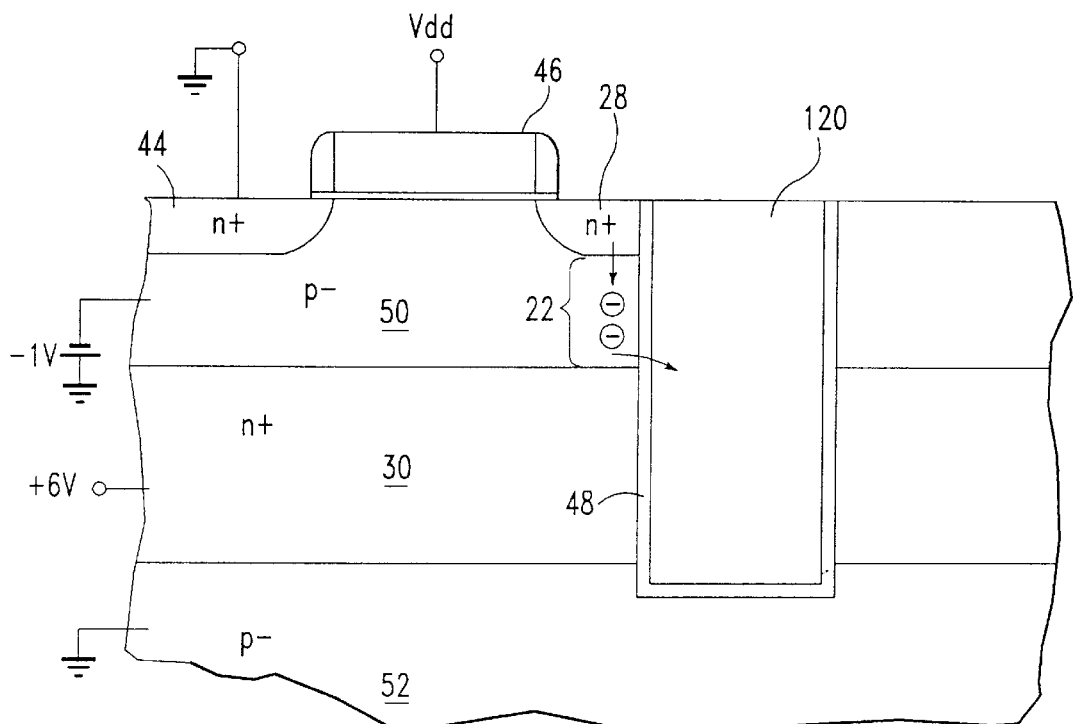
FIG. 4a is a cross sectional view illustrating the first write embodiment by hot electron injection according to the present invention.

In the first write embodiment, negative charge is stored on floating gate 120 by hot electron injection. As illustrated in FIG. 4a, the voltage on buried n well 30 is raised to a high level, about 6V, and since floating gate 120 is capacitively coupled to buried n well 30, its voltage is brought above the Vt of vertical FET 22. The voltage on wordline 46 is raised to Vdd (about 3.3V) to turn on planar FET 29, and bitline 44 is held at ground. Substrate 52 is also held at ground and p well 50 is biased to about −1V. Electrons flowing in the electric field near buried n well 30 are rapidly accelerated, and a portion of these channel hot electrons are injected through insulator 48 into floating gate 120. Thus, a negative charge is stored in floating gate 120, and the Vt of vertical FET 22 is raised. To avoid writing other cells along wordline 46, all other bitlines of the array are raised to a voltage, such as Vdd.

Figure 4B:
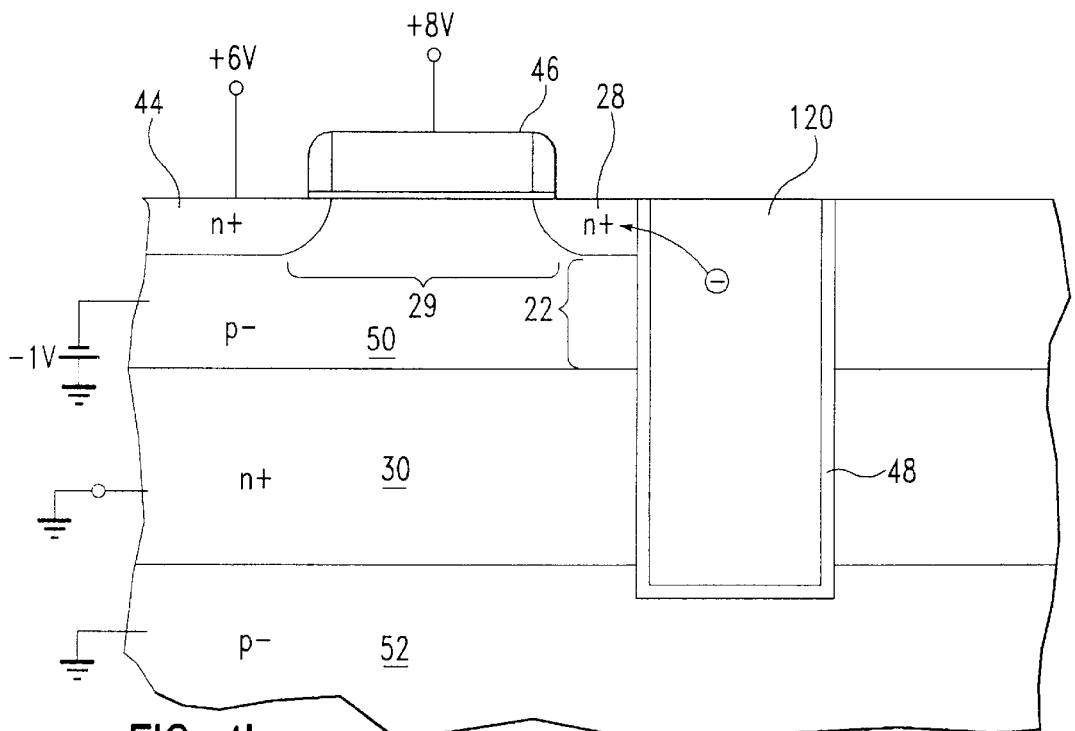
FIG. 4b is a cross sectional view illustrating the second write embodiment by Fowler-Nordheim tunneling according to the present invention.

In the second write embodiment, negative charge is removed from floating gate 120 by Fowler-Nordheim tunneling from floating gate 120 to n+ node diffusion 28, leaving the floating gate positively charged. As illustrated in FIG. 4b, the voltage on buried n well 30 is lowered to ground, and since floating gate 120 is strongly capacitively coupled to buried n well 30, its voltage is brought low. The voltage on bitline 44 is raised to about 6V, and word line 46 is raised to about 8V to turn on planar FET 29 and provide a voltage close to 6V at node diffusion 28. Electrons are emitted by Fowler-Nordheim tunneling from floating gate 120 to planar n+ node diffusion 28. Thus, a positive charge is stored in floating gate 120, and the Vt of vertical FET 22 is lowered.

Read

Figure 5A:
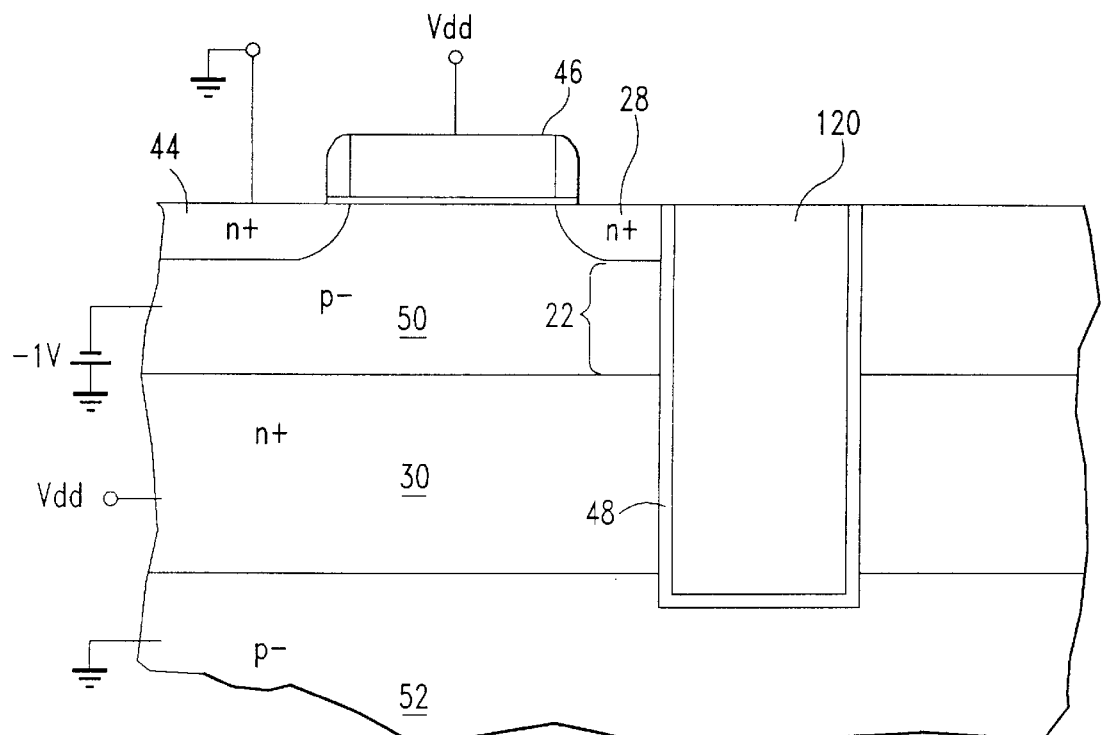
FIGS. 5a–5b are cross sectional views illustrating read operations corresponding to the write operations of FIGS. 4a–4b.

Reading is accomplished by detecting or measuring a current through series connected FETs 29 and 22, effectively detecting the Vt of vertical FET 22. The reading procedure depends on the write procedure selected; thus there are two embodiments of the read operation. The first read embodiment, corresponding to the first write embodiment of FIG. 4a, is illustrated in FIG. 5a. The voltage on buried n well 30 is raised to Vdd, and since floating gate 120 is strongly capacitively coupled to buried n well 30, its voltage is brought up. The voltage on word line 46 is raised to turn on planar FET 29, and bitline 44 is brought to ground, so node diffusion 28 is also brought to ground. If vertical FET 22 is in the low Vt state (no CHEF electrons), then the voltage coupled to floating gate 120 is enough to turn on vertical FET 22. If vertical FET 22 is in a high Vt state, then the read voltage coupled to floating gate 120 is not enough to turn on vertical FET 22. The presence or absence of current flow through the series circuit therefore tells the Vt state of FET 22.

Figure 5B:
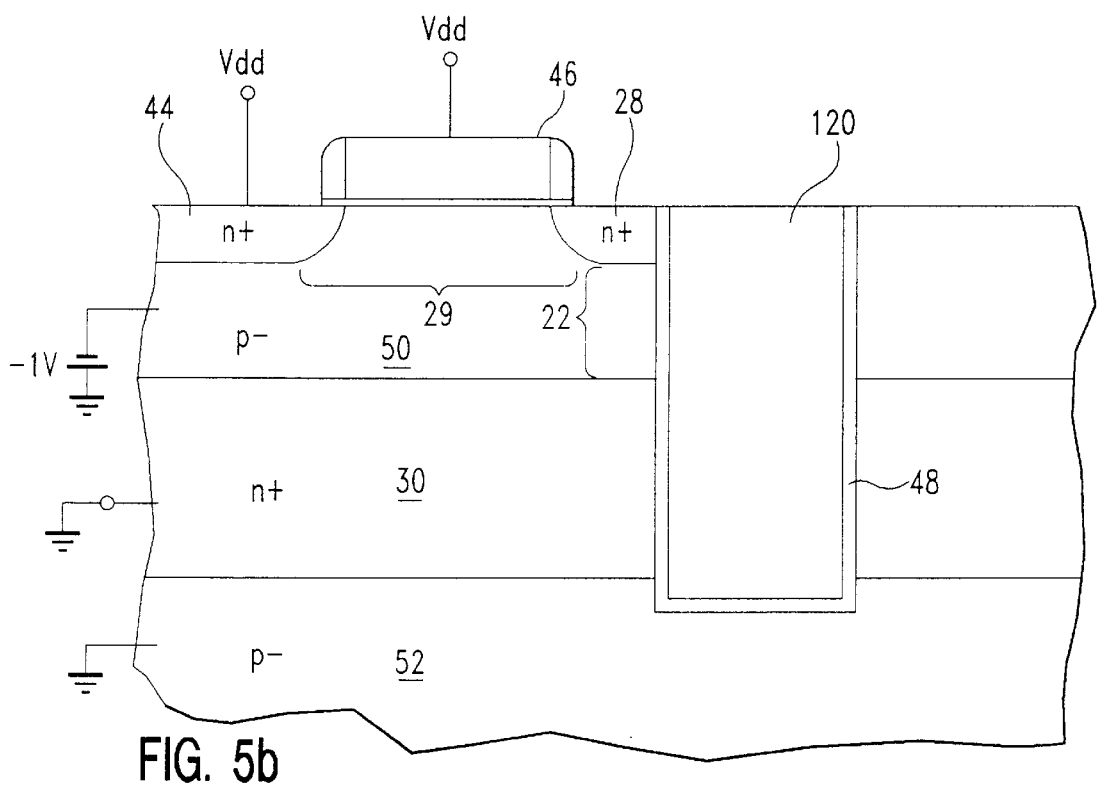

The second read embodiment, corresponding to the second write embodiment, is illustrated in FIG. 5b. The voltage on buried n well 30 is kept at ground, and since floating gate 120 is strongly capacitively coupled to buried n well 30, its voltage is kept low as well. The voltage on word line 46 is raised to Vdd to turn on planar FET 29, and bitline 44 is also brought to Vdd, so node diffusion 28 is brought to a positive voltage. If floating gate 120 had been positively charged in the write step of FIG. 4b, and vertical FEF 22 is therefore in the low Vt state, then the low voltage coupled to floating gate 120 is still enough to turn on vertical FET 22. If vertical FET 22 had not been written by Fowler-Nordheim tunneling in the write step of FIG. 4b and remains in the high Vt state for this embodiment, then the low voltage coupled to floating gate 120 is not enough to turn on vertical FET 22, and current does not flow.

Erase

The erase procedure depends on the write procedure selected. If the write operation consisted of raising Vt by hot electron injection (the first write embodiment), erasure requires that electrons be emitted from floating gate 120. A procedure similar to the Fowler-Nordheim tunneling procedure described above and illustrated in FIG. 4b for the second write embodiment can be used to erase cells having negatively charged floating gates. However, in this case wordline and bitline voltage should be about 1V lower (7V and 5V respectively) since the floating gate is charged negatively to d potential of about a volt and the desired result of the erase is a neutral floating gate.

Figure 6:
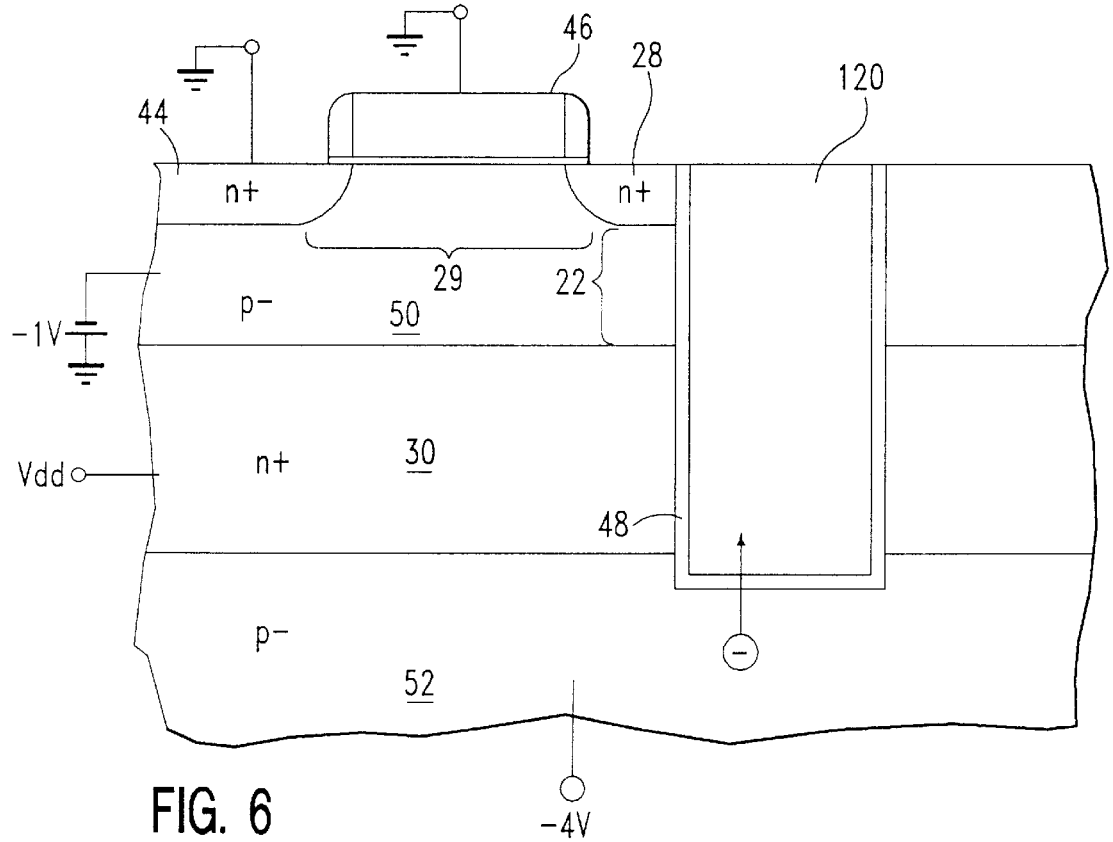
FIG. 6 is a cross sectional view illustrating a flash erase operation by Fowler-Nordheim tunneling for a cell written according to the second write embodiment of FIG. 4b.

If the write operation consisted of lowering Vt by positive charging of floating gate 120 by Fowler-Nordheim tunneling (the second write embodiment), erasure requires electron emission to the gate. This can be accomplished in a blanket or flash mode without addressing wordlines 46 and bitlines 44 by another Fowler-Nordheim tunneling step, as illustrated in FIG. 6. The voltage on buried n well 30 is held at its normal positive level, Vdd or pulled to a 1V higher potential. Since all floating gates 120 are strongly capacitively coupled to buried n well 30, all will have positive voltages proportional to that applied to buried n well 30. But, those floating gates that had been positively charged in a previous write step will be coupled to a higher voltage than those that had not been positively charged. The voltage on substrate 52 is lowered to a negative potential of about −4V so that electrons will be emitted by Fowler-Nordheim tunneling from substrate 52 to those floating gates that are at the high potential.

Steps for fabricating the EPROM cell of the present invention follow closely the steps for fabricating a trench capacitor DRAM cell presented in commonly assigned U.S. Pat. Nos. 5,264,716, (the "'716 patent") by Kenney, 5,250,829, by Bronner et al., and 5,384,474, by Park et al., and in U.S. Pat. No. 4,794,434, by Pelley, incorporated herein by reference. The present EPROM cell differs in that the collar and strap processes described in those patents are omitted.

In addition, to provide access to the substrate from the bottom of the trench for the flash erase described hereinabove, a directional etch can be used to remove doped glass from the bottom of the trench before the buried plate diffusion step described in the '716 patent Alternatively, a third deep trench etch can be used after all doped glass is removed after the diffusion to etch through the n+ plate under the trench.

Floating gate dielectric 48 (FIG.2) can be the standard dielectric used in DRAM trench capacitors, formed of silicon oxide, silicon nitride, tantalum pentoxide, or combinations thereof. If desired, a thin insulator can be provided adjacent node diffusion 28 by recess etching trench conductor 24, removing exposed insulator, and regrowing thin insulator to enhance the Fowler-Nordheim tunneling of FIG. 4b.

The buried plate diffusion of arsenic step described in the '716 patent provides a high concentration of dopant for n well 30, in the $10^{19}$ range, with an abrupt junction that is suitable for hot electron injection. A single interconnected buried plate can be provided for an entire array or the buried plate can be laid out broken up into strips. Dividing n well 30 into strips would provide advantage in that it would require a smaller driver than would be required to drive a fill array buried plate capacitance during a write operation.

For chips having both EPROM cells and DRAM cells, a trench collar and strap are needed for the DRAM cells and not for the EPROM cells. The trench collar steps are most simply omitted for the EPROM cells by providing an additional mask so the EPROM cells are protected during the trench recess RIE etch process used to form the collar. The protection mask can be intrinsic polysilicon. It is also possible to etch the collar out of the EPROM trenches.

The strap steps are omitted for the EPROM cells by altering the existing strap mask so EPROM cell trenches are protected during the etch of oxide at the DRAM cell trench tops used to form the strap.

In addition, in a chip having a buried plate DRAM cell, access to the substrate exclusively at the trench bottom of EPROM cells for flash erase can be achieved as described hereinabove by providing a blocking mask for the DRAM cells either during the directional etch of the doped glass or during a third deep trench that penetrates through the buried plate beneath the trench. Thus, totally independent nonvolatile memory cells and DRAM cells can be formed on the same chip with the process for forming the nonvolatile memory substantially contained within the DRAM process.

While several embodiments of the invention, together with modifications thereof, have been described in detail herein and illustrated in the accompanying drawings, it will be evident that various further modifications are possible without departing from the scope of the invention. For example, while silicon is preferred, other semiconducting materials can also be used, such as germanium, silicon-germanium, and gallium arsenide. Nothing in the above specification is intended to limit the invention more narrowly than the appended claims. The examples given are intended only to be illustrative rather than exclusive.

What is claimed is:

1. A semiconductor chip comprising a nonvolatile memory cell having a vertical floating gate adjacent a vertical channel of a vertical FET and a buried diffusion surrounding said floating gate, said buried diffusion serving as a control electrode, said floating gate capacitively coupled predominantly to said buried diffusion.

2. A semiconductor chip as recited in claim 1, wherein said non-volatile memory cell comprises a planar FET in series with a vertical floating gate FET.

3. A semiconductor chip as recited in claim 2, wherein said vertical floating gate FET shares a diffusion with said planar FET.

4. A semiconductor chip as recited in claim 1, further comprising a DRAM memory cell, wherein said nonvolatile memory cell and said DRAM memory cell cover substantially equal surface areas on the chip.

5. A semiconductor chip as recited in claim 4, wherein said non-volatile memory cell is formed in a process substantially included in the process of fabricating said DRAM memory cell.

* * * * *